(12) United States Patent
Dimasacat et al.

(10) Patent No.: US 7,838,973 B2
(45) Date of Patent: Nov. 23, 2010

(54) SEMICONDUCTOR DEVICE

(75) Inventors: Jose Joel Dimasacat, Pasig (PH); Jerry Lutiva Tan, Calamba (PH); Willem Dirk Van Driel, Den Bosch (NL)

(73) Assignee: NXP B.V., Eindhoven (NL)

(*) Notice: Subject to any disclaimer, the term of this patent is extended or adjusted under 35 U.S.C. 154(b) by 0 days.

(21) Appl. No.: 11/994,903

(22) PCT Filed: Jul. 5, 2006

(86) PCT No.: PCT/IB2006/052264
§ 371 (c)(1),
(2), (4) Date: Aug. 8, 2008

(87) PCT Pub. No.: WO2007/007239
PCT Pub. Date: Jan. 18, 2007

(65) Prior Publication Data
US 2009/0152696 A1    Jun. 18, 2009

(30) Foreign Application Priority Data
Jul. 8, 2005   (EP) ................................. 05106260

(51) Int. Cl.
*H01L 23/495*    (2006.01)
(52) U.S. Cl. ............... 257/676; 257/690; 257/E21.499; 257/E23.031
(58) Field of Classification Search ................. 257/676, 257/690, E21.499, E23.031
See application file for complete search history.

(56) References Cited

U.S. PATENT DOCUMENTS

| | | | |
|---|---|---|---|
| 6,388,311 B1 * | 5/2002 | Nakashima et al. | 257/676 |
| 6,455,348 B1 | 9/2002 | Yamaguchi | |
| 6,545,347 B2 | 4/2003 | McClellan | |
| 6,569,755 B2 | 5/2003 | Yamada et al. | |
| 6,713,849 B2 * | 3/2004 | Hasebe et al. | 257/667 |
| 6,894,382 B1 | 5/2005 | Awad et al. | |
| 2003/0080396 A1 | 5/2003 | Kaneda et al. | |

* cited by examiner

*Primary Examiner*—Tan N Tran

(57) ABSTRACT

A semi-conductor device (100) comprises an exposed leadframe (10) with a die pad (11) and a plurality of leads (12). The die pad (11) has a substantially flat bottom surface (14) and a top surface (15). A semi-conductor die (2) is attached to a die attachment portion (31) of the top surface (15). Downbonds (5) connect the die (2) to a downbond attachment portion (32). Standard bonds (4) connect the die (2) to the leads (12). A plastic package (6) encapsulates the die (2), the standard bonds (4) and the downbonds (5). The top surface of the die pad has portions located at different levels, and stepshaped transitions between two adjacent ones of such portions. At least one of such step-shaped transition (36) is located between the die (2) and the downbonds (5). It has been found that such step-shaped transition provides good protection against downbond failure.

19 Claims, 5 Drawing Sheets

SEMICONDUCTOR DEVICE

The present invention relates in general to semi-conductor devices of a type wherein a semi-conductor chip is mounted in a plastic package.

Semi-conductor devices as such are commonly known. The following is a brief description of the general design of such a device. FIG. 1 shows a schematic cross-section of a semi-conductor device 1. The device comprises a semi-conductor chip 2, also indicated as "die", with an integrated circuit (not shown). The device further comprises a conductive leadframe 10, typically made of a metal such as copper, the leadframe 10 comprising a centrally located die pad 11 and a plurality of internal leads 12 (of which only two are visible in the cross-section of FIG. 1). The die 2 is attached to the die pad 11 through an adhesive 3, which typically is an electrically and/or thermally conductive adhesive. Typically, the die pad 11 has a quadrangular, usually even square shape. Different embodiments may have different sizes; in one typical example, the semi-conductor device 1 has a size of 7 mm×7 mm, in which case the die pad 11 has a size of 5 mm×5 mm.

The integrated circuit of the die 11 has contact terminals in its surface directed away from the die pad 11, which contact terminals (not shown) are connected to respective leads 12 via respective wire bonds 4, i.e. thin wires, for instance gold wires, having one end attached to a lead 12 and having the other end attached to the die 2. The leads 12 provide input and/or output terminals for the device 1, to receive or provide input signals or output signals. Since the use of such bonds is known per se, and methods for attaching such bonds to the leads and the die are known per se, it is not necessary here to explain such methods in greater detail.

Some points of the integrated circuit need to be connected to a common potential, typically ground level. Thus, the integrated circuit of the die 11 further has contact terminals which are connected to the die pad 11 via respective wire bonds 5; these wire bonds, connecting the die 2 to the die pad 11, are indicated as "downbonds".

The assembly of leadframe 10, die 2 and bonds 4 and 5 is encapsulated in a plastic molded package 6. In some types of devices, the leadframe 10 is fully surrounded by plastic. The device 1 of FIG. 1 has its leadframe 10 exposed, i.e. the leadframe 10 has a surface 14 available for electrical and thermal contact to the outside world; in the following, this surface, which is directed away from the die 2, will be indicated as bottom surface 14, while the opposite surface will be indicated as top surface 15. Typically, and as shown at 16, the die pad 11 has in its bottom surface 14 an undercutting 16A, also indicated as "half etch", has extending along the edges of the die pad 11, for a better engagement between plastic 6 and die pad 11. Similarly, the leads 12 typically have in their bottom surface 14 an undercutting 16B. The present invention relates specifically, although not exclusively, to an exposed leadframe package.

It has been found that the downbonds are very vulnerable, and failure of the downbonds has been observed frequently, while already one failure leads to reject of the entire device. According to the invention, two mechanisms are probably responsible for failing of the downbonds, as will be explained in the following.

The process for manufacturing such device 1 comprises the steps of assembling the die 2 to the leadframe 10, applying the standard wirebonds 4 and the downbonds 5, and then applying the plastic compound 6. The plastic compound 6 is applied in a molten state, i.e. at an elevated temperature, and needs to cool down, leading to mechanical stresses due to the thermal expansion coefficient of the plastic. Further, during its lifetime, the device 1 may be subjected to further temperature cycles, also leading to mechanical stresses.

FIG. 2, on a larger scale, illustrates two mechanisms that are considered to be probably responsible for a large percentage of the failure of the downbonds 5. As indicated by arrow 21, the plastic may directly exert forces on the downbond wires 5. As indicated at 22, delamination may occur at the interface between die 2 and die pad 11, and this delamination, which may be considered as a creeping crack, may increase along the top surface 15 of the die pad 11, as indicated at 23. Eventually, a downbond 5 may break (metal fatigue, and/or tear), as indicated at 24.

It is an important objective of the present invention to increase the reliability of the downbonds. More specifically, the present invention aims to improve the design of a semi-conductor device such that the chances on failure of the downbonds are greatly reduced.

In the prior art design of the semi-conductor devices, the top surface 15 of the die pad 11 is entirely flat, i.e. extends in one plane over its entire extent. According to an important aspect of the present invention, the top surface 15 of the die pad 11 has portions located at different levels, and substantially step-shaped transitions between two adjacent ones of such portions, at least one of such step-shaped transition being located between the die 2 and the downbonds 5. It has been found that such step-shaped transition provides good protection against downbond failure.

Preferably, the die pad has one or more recesses, more preferably shaped as a longitudinal groove parallel to its side edges, at a location between the die and the downbonds, such recesses being entirely filled with the plastic material of the package.

It is noted that U.S. Pat. No. 6,569,755 discloses a semi-conductor device where a die pad has a groove at a location between the downbonds and the edge of the pad, the groove being filled with silicone. Such design does not protect the downbonds against delaminations creeping outwards from the die, and diminishes the mutual engagement between die pad and plastic. Further, the filling of silicone requires an additional process step.

It is noted that U.S. Pat. No. 6,545,347 discloses a semi-conductor device where the downbonds are not connected to the die pad but to a separate ring that is arranged around the die pad and at its corners is connected to the die pad mechanically and electrically. Such design has a disadvantage that, in the manufacturing step where molten plastic is applied, the risk is increased that the plastic may pass through the space between the die and the ring and cover the bottom side of the leadframe (flash problem), which may lead to reject or the necessity of a further process step for removing the superfluous plastic.

These and other aspects, features and advantages of the present invention will be further explained by the following description with reference to the drawings, in which same reference numerals indicate same or similar parts, and in which:

FIG. 1 schematically shows a cross-section of a prior art semi-conductor device;

FIG. 2 schematically shows a detail of the prior art semi-conductor device of FIG. 1 to illustrate downbond failure;

Figure 1:
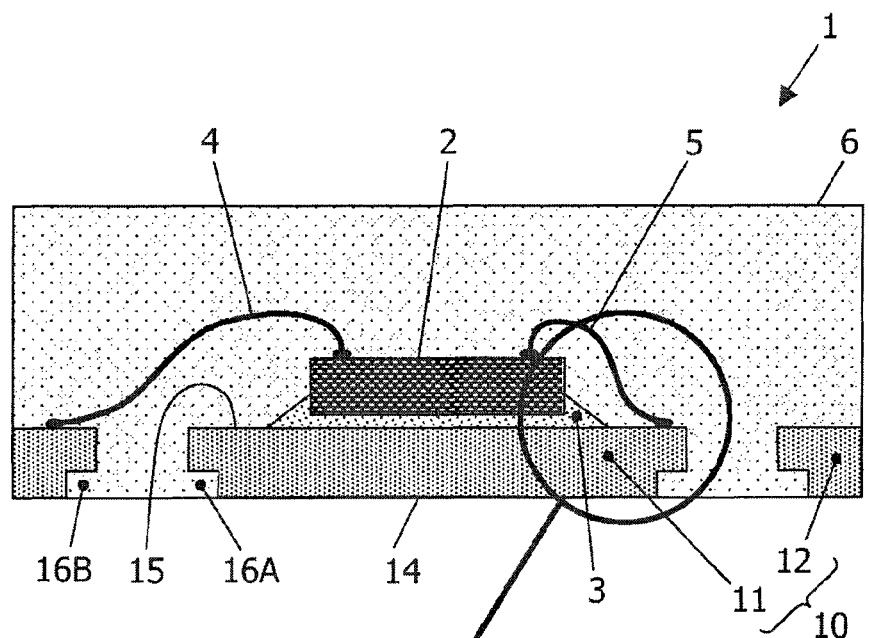
Figure 2:
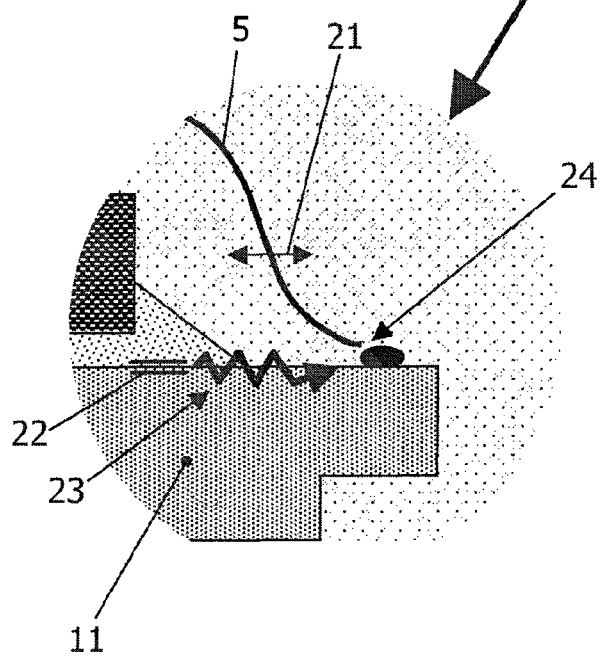
Figure 3:
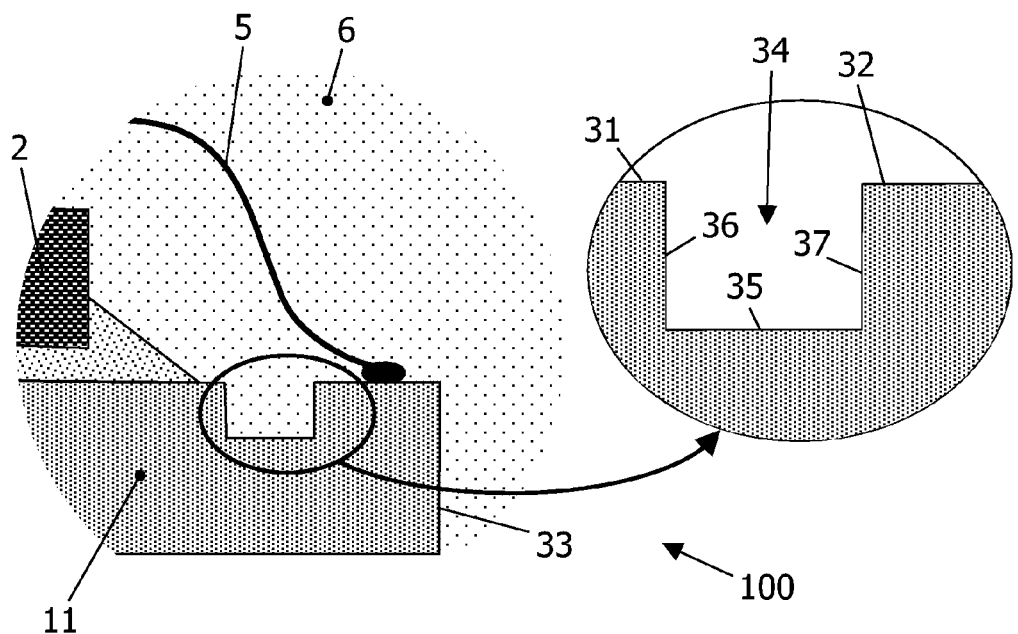
FIGS. 3-8 are schematic views comparable to FIG. 2, showing details of embodiments of the present invention.

FIG. 3 is a view comparable to FIG. 2, illustrating a detail (not to scale) of a preferred embodiment of semi-conductor device 100 according to the present invention. In this figure, undercutting 16 is not shown for sake of simplicity, but such undercutting will preferably be present, indeed. As is known per se, and therefore not illustrated, the leadframe 10 is made starting from a standard solid flat strip of a predetermined thickness, typically approximately 0.2 mm. In this strip, an array of leadframes is formed by etching; in a later stage, the individual leadframes are separated from each other by a sawing process.

The top surface 15 of the die pad 11 has a first top surface portion 31 where the die 2 is mounted, and a second top surface portion 32 where the down bonds 5 are attached. The first top surface portion 31, which will also be indicated as die attachment surface portion, is a central portion of the top surface 15, while the second top surface portion 32, which will also be indicated as downbond attachment surface portion, extends along the side edges 33 of the die pad 11. Between the first top surface portion 31 and the second top surface portion 32, a groove 34 is formed in the top surface 15, having a bottom 35 at a level lower than the top surface 15. The groove 34 has a longitudinal direction extending preferably substantially parallel to the side edges 33 of the die pad 11, i.e. perpendicular to the plane of drawing. The groove 34 is filled entirely with plastic 6.

The groove 34 is preferably formed by an etching process, etching to a depth corresponding to only a part of the thickness of the die pad. This etching step can be combined with the above-mentioned etching process that forms the leadframe out of "solid" strip material, so the costs of manufacturing the groove are minimal. It is noted that the etching process leaves the flatness of the bottom surface 14 of the leadframe 10 unaffected, in contrast to, for instance, a punching process.

The width of the groove is not critical, but will in practice be limited by the available space between the die 2 and the bonds 5. In a suitable experimental embodiment, the groove 34 has a width of approximately 0.15 mm.

Likewise, the depth of the groove is not critical. However, the groove should not be too shallow, because then its effect might be less adequate, while also it should not be too deep because then the risk increases that the groove penetrates the die pad 11. In a suitable experimental embodiment, where the die pad 11 has a thickness of approximately 0.2 mm, the groove 34 has a depth of approximately 0.12 mm. In general, the groove 34 preferably has a depth approximately half the thickness of the die pad 11, and a width approximately equal to or somewhat larger than the depth.

In the figure, the groove 34 is shown as having a substantially rectangular contour. Since the groove is preferably etched out of the die pad material, the actual shape will deviate somewhat from exactly rectangular, but the exact shape is not critical.

The groove 34 defines a first stepwise transition 36 between the die attachment surface portion 31 and the bottom 35 of the groove, and a second stepwise transition 37 between the bottom 35 and the downbond attachment surface portion 32. This first stepwise transition 36 prevents a delamination 22 (see FIG. 2) originating from the die area from reaching the downbond area. Further, the interlocking arrangement of the plastic 6 engaging in the groove 34 reduces the magnitude of stresses acting on the downbonds 5. As a result, the downbonds 5 are less likely to fail.

Figure 3A:
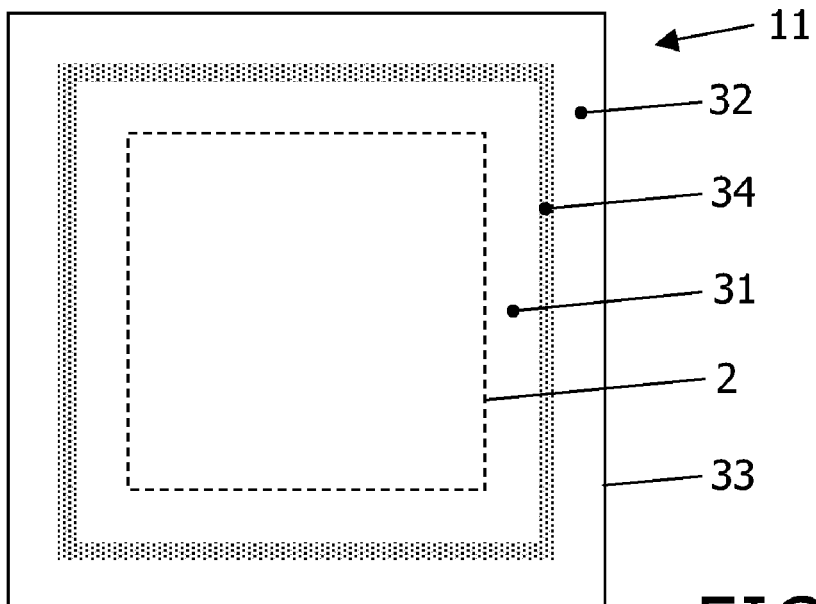
FIGS. 3A and 3B are schematic top views of embodiments of a die pad.
Figure 3B:
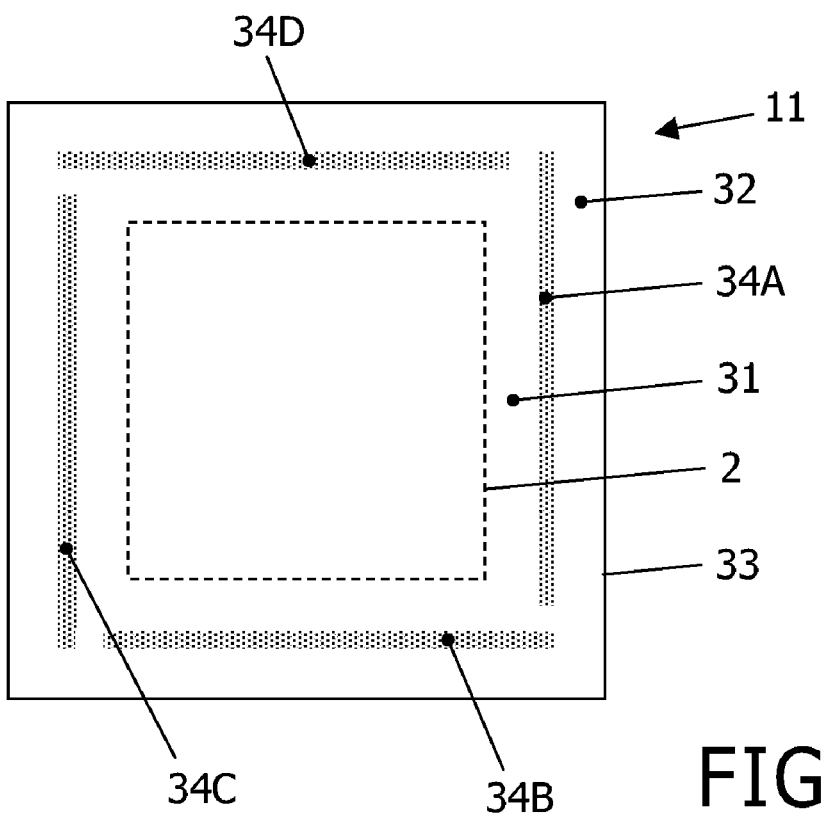

FIG. 3A is a schematic top view of the die pad 11, wherein the position of the die 2 is indicated in broken lines. The figure shows that the groove 34 preferably has the shape of a continuous, endless square loop that is closed in itself, extending around the die attachment surface portion 31. However, as shown in FIG. 3B, it is also possible that the groove 34 comprises an assembly of four longitudinal grooves 34A, 34B, 34C, 34D, each extending parallel to a corresponding side edge of the die pad, the individual longitudinal grooves not being connected to each other. Further, it is possible that a longitudinal groove is replaced by a series of recesses, preferably aligned with each other. Each of such recesses may have an elongated shape, but they may also be square, circular, etc. At least one such recess already provides an improvement in accordance with the invention, but preferably the series of recesses extend along the entire collection of leads 12.

Figure 4:
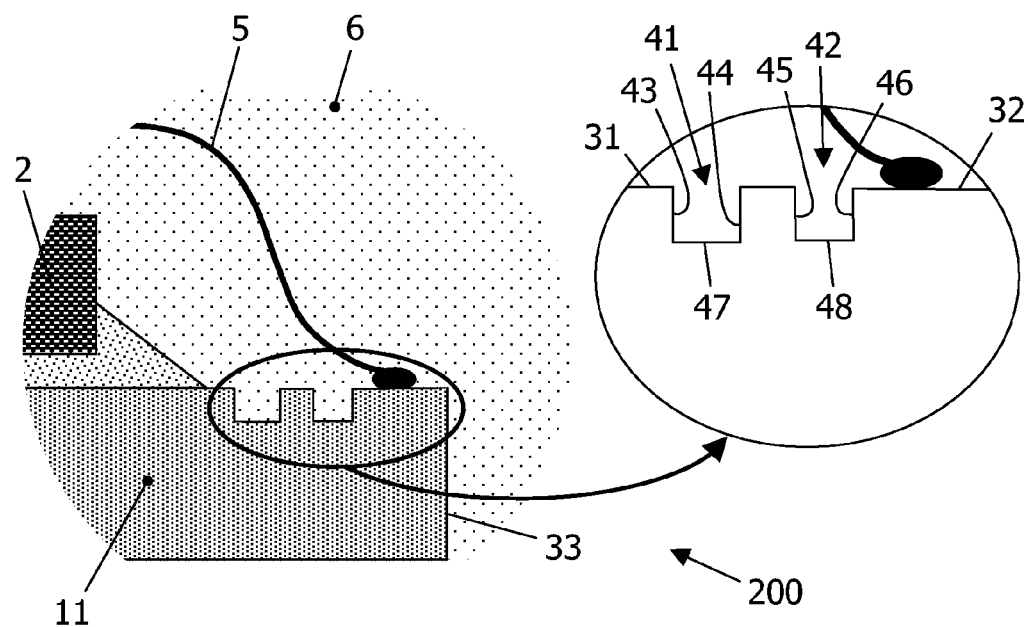

FIG. 4 illustrates a detail of an embodiment 200 of a semiconductor device, as a variation of the embodiment 100 of FIG. 3. In embodiment 200, two mutually parallel grooves 41 and 42 are formed in the region between the die attachment surface portion 31 and the downbond attachment surface portion 32. For each of said grooves 41, 42, the same applies as what has been mentioned for groove 34; especially, these grooves are entirely filled with plastic. In this embodiment 200 as shown, a first groove 41 has side walls 43, 44 and a bottom 47, while a second groove 42 has side walls 45, 46 and a bottom 48, said bottoms 47, 48 being located at a level differing from the level of the die attachment surface portion 31. In this embodiment 200, four stepwise transitions 43, 44 and 45, 46 are defined by the walls of said two grooves 41, 42.

In principle, multiple parallel grooves are possible, but in view of space constraints this will hardly be practical.

Figure 5:
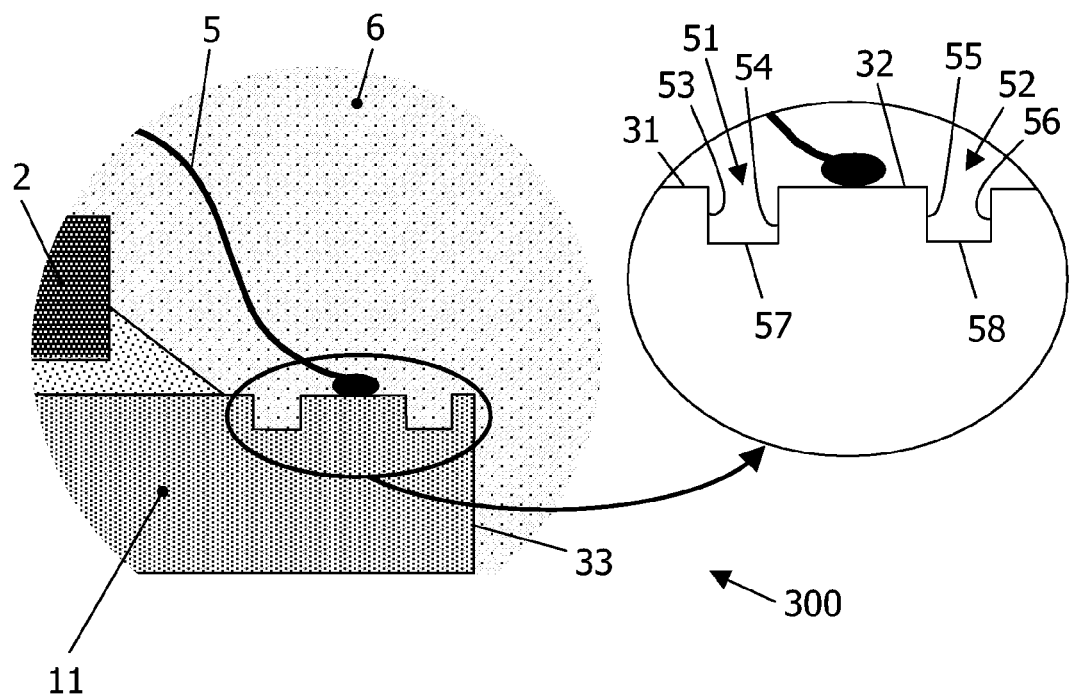

FIG. 5 illustrates a detail of an embodiment 300 of a semiconductor device, as a variation of the embodiment 100 of FIG. 3. In embodiment 300, a first groove 51 is formed in the region between the die attachment surface portion 31 and the downbond attachment surface portion 32, and a second groove 52 is formed in the region between the downbond attachment surface portion 32 and the corresponding side edge 33 of the die pad 11. For each of said grooves 51, 52, the same applies as what has been mentioned for groove 34; especially, these grooves are entirely filled with plastic. In this embodiment 300 as shown, a first groove 51 has side walls 53, 54 and a bottom 57, while a second groove 52 has side walls 55, 56 and a bottom 58, said bottoms 57, 58 being located at a level differing from the level of the die attachment surface portion 31. In this embodiment 300, two stepwise transitions 53, 54 are defined by the walls of said first groove 51 between the die attachment surface portion 31 and the downbond attachment surface portion 32; in this respect, the first groove 51 corresponds to groove 34 of FIG. 3. Further, two stepwise transitions 55, 56 are defined by the walls of said second groove 52 in the region between the downbond attachment surface portion 32 and the side edge 33. This second groove 52 provides further increased mechanical coupling between die pad 11 and plastic 6, and also provides protection against delamination originating at the side edge 33.

Figure 6:
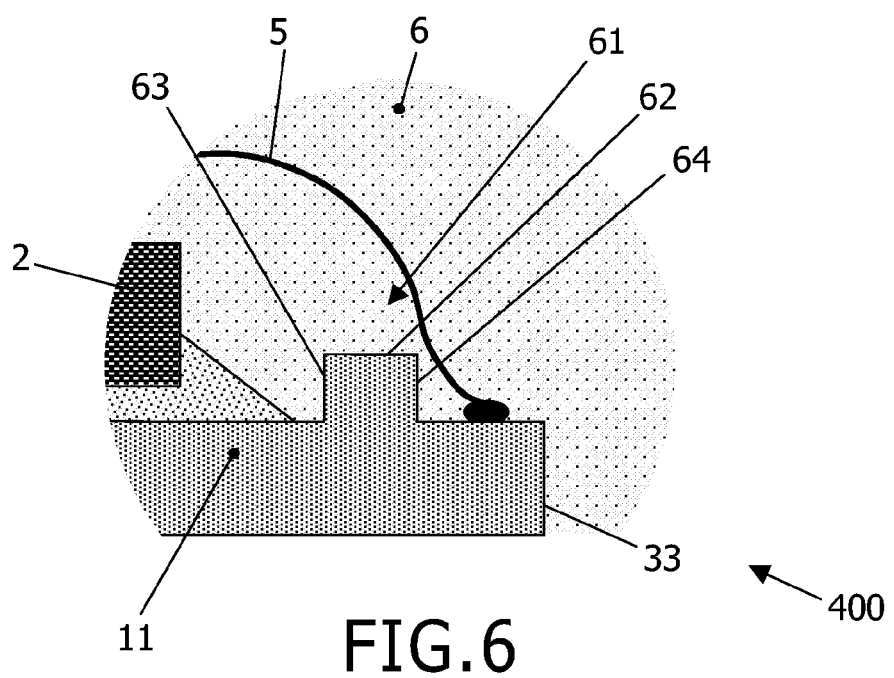

FIG. 6 illustrates a detail of an embodiment 400 of a semiconductor device, as a variation of the embodiment 100 of FIG. 3. In embodiment 400, instead of a groove 34, a ridge 61 is formed on the top surface 15 of the die pad 11. Actually, the final shape of the die pad 11 is obtained by starting from plate material having the normal standard thickness and etching away the die attachment surface portion 31 and the downbond attachment surface portion 32 until a certain depth, leaving the top surface 62 of the ridge 61 at the original height.

Like the groove 34, the ridge 61 may extend as a closed loop around the die 2, or the ridge 61 may comprise a series of elevated portions. Also, two parallel ridges may be present in the region between the die attachment surface portion 31 and the downbond attachment surface portion 32 (not shown).

Also, a second ridge may be present in the region between the downbond attachment surface portion 32 and the side edge 33 of the die pad 11 (not shown).

The ridge 61 defines a first stepwise transition 63 between the die attachment surface portion 31 and the top 62 35 of the ridge, and a second stepwise transition 64 between the top 62 and the downbond attachment surface portion 32. This first stepwise transition 63 prevents a delamination 22 (see FIG. 2) originating from the die area from reaching the downbond area. Further, the interlocking arrangement of the ridge 61 engaging in the plastic 6 reduces the magnitude of stresses acting on the downbonds 5. As a result, the downbonds 5 are less likely to fail.

In the embodiments described above, the number of stepwise transitions is always even, as a groove or a ridge always have two opposite walls defining such transitions. However, it is possible that the number of stepwise transitions is odd, and this number may even be equal to one. For instance, in certain practical cases, the region between die attachment surface portion 31 and downbond attachment surface portion 32 may not be large enough for making a groove or a ridge.

Figure 7:
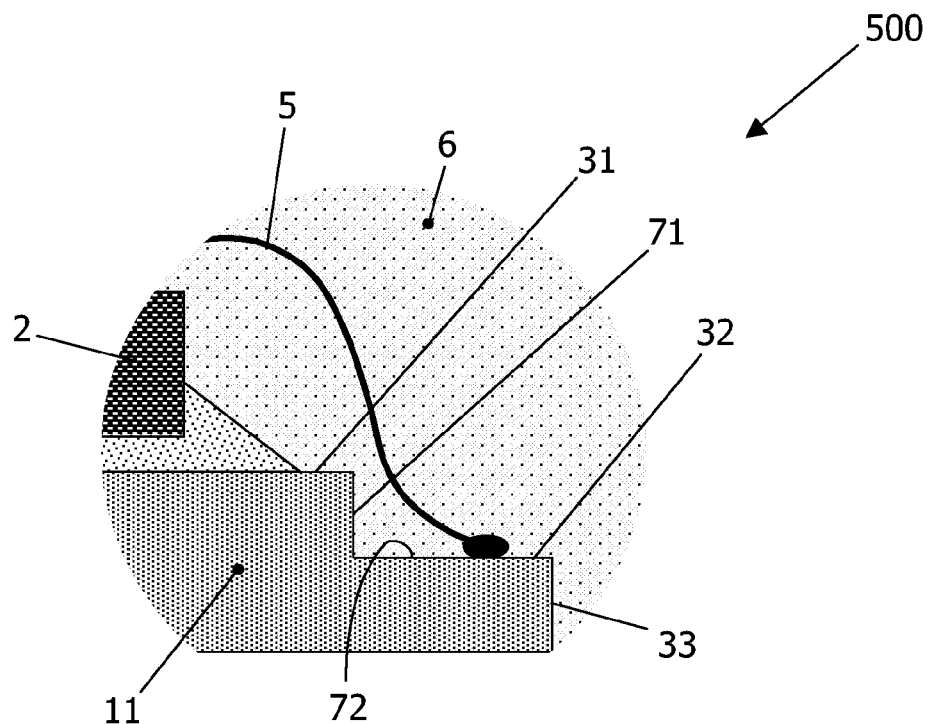
Figure 8:
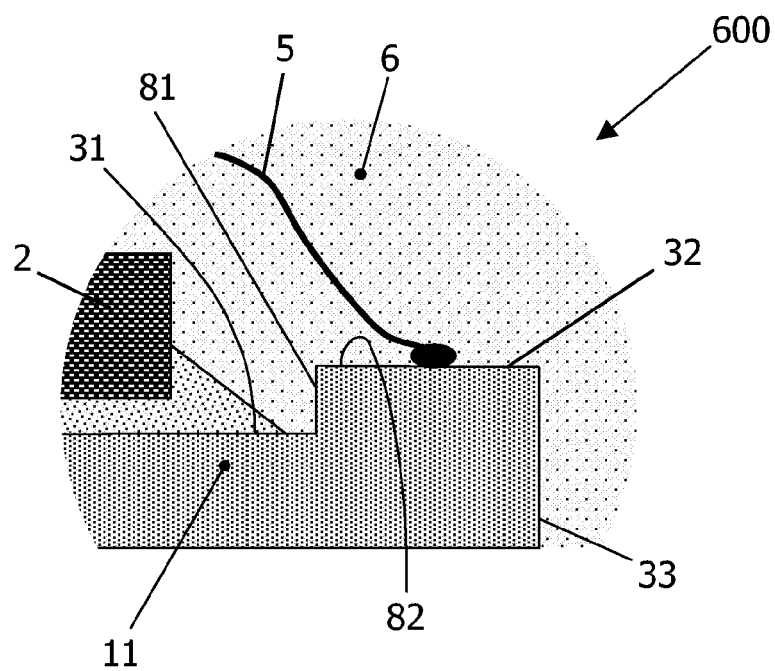

FIGS. 7 and 8 illustrate details of embodiment 500 and 600, respectively, as variations of the embodiment 100 of FIG. 3.

In embodiment 500 of FIG. 7, the downbond attachment surface portion 32 is out-of-plane with the die attachment surface portion 31, i.e. the downbond attachment surface portion 32 is located at a level differing from the level of the die attachment surface portion 31. More particularly, in embodiment 500, the downbond attachment surface portion 32 is located at a lower level than the die attachment surface portion 31, preferably as a result of the downbond attachment surface portion 32 being etched away until a desired depth. Between the die attachment surface portion 31 and the downbond attachment surface portion 32, a stepwise transition 71 is defined between the level of the die attachment surface portion 31 and the level of the downbond attachment surface portion 32, or, more generally, between the level of the die attachment surface portion 31 and the level of a third surface portion 72 which, here, is level with the downbond attachment surface portion 32. This stepwise transition 71 has the same effect as described above for first stepwise transition 36 of embodiment 100.

In embodiment 600 of FIG. 8, the downbond attachment surface portion 32 is located at a higher level than the die attachment surface portion 31, preferably as a result of the die attachment surface portion 31 being etched away until a desired depth. Between the die attachment surface portion 31 and the downbond attachment surface portion 32, a stepwise transition 81 is defined between the level of the die attachment surface portion 31 and the level of the downbond attachment surface portion 32, or, more generally, between the level of the die attachment surface portion 31 and the level of a third surface portion 82 which, here, is level with the downbond attachment surface portion 32. This stepwise transition 81 has a similar effect as described above for first stepwise transition 36 of embodiment 100.

It should be clear to a person skilled in the art that the present invention is not limited to the exemplary embodiments discussed above, but that several variations and modifications are possible within the protective scope of the invention as defined in the appending claims.

The invention claimed is:

1. Leadframe for a semi-conductor device, comprising a die pad for mounting a semi-conductor die and a plurality of leads for connection with the semi-conductor die, the leads being arranged at a distance from the die pad;

wherein the die pad has a substantially flat bottom surface and a top surface, the top surface having a die attachment portion and a downbond attachment portion for connecting downbonds, the die attachment surface portion and the downbond attachment surface portion being at different levels from each other;

wherein, at least one location between the die attachment surface portion and the downbond attachment surface portion, the top surface of the die pad has at least one third surface portion that is out-of-plane with the die attachment surface portion, and at least one substantially step-shaped surface transition between the die attachment surface portion and said third surface portion.

2. Leadframe according to claim 1, wherein said transition has been formed by etching away a part of the top surface.

3. Leadframe according to claim 1, wherein, at a location between the die attachment surface portion and the downbond attachment surface portion, the die pad has at least one recess in its top surface, wherein said third surface portion is defined by a bottom of said recess, and wherein said step-shaped transition is defined by a wall of said recess.

4. Leadframe according to claim 3, wherein the said recess is formed as a groove directed substantially parallel to a side edge of the die pad.

5. Leadframe according to claim 4, wherein said groove is an annular, endless groove with a substantially rectangular shape, corresponding to the shape of the die pad.

6. Leadframe according to claim 3, wherein said recess has a substantially rectangular cross-sectional contour.

7. Leadframe according to claim 3, wherein the downbond attachment surface portion is aligned with the die attachment surface portion.

8. Leadframe according to claim 3, wherein the die pad has at least one further recess in its top surface, at a location between the downbond attachment surface portion and a side edge of the die pad.

9. Leadframe according to claim 1, wherein, at a location between the die attachment surface portion and the downbond attachment surface portion, the die pad has at least one ridge on its top surface, wherein said third surface portion is defined by a top of said ridge, and wherein said step-shaped transition is defined by a wall of said ridge.

10. Leadframe according to claim 9, wherein said ridge has been formed by etching away parts of the lead frame base material to form the die attachment surface portion and the downbond attachment surface portion, respectively.

11. Leadframe according to claim 1, wherein the die attachment surface portion and the downbond attachment surface portion are out-of-plane with each other, wherein said step-shaped transition is defined by a transition between the die attachment surface portion and the downbond attachment surface portion.

12. Leadframe according to claim 11, wherein said third surface is at the same level as the downbond attachment surface portion.

13. Leadframe for a semi-conductor device, comprising a die pad for mounting a semi-conductor die and a plurality of leads for connection with the semi-conductor die, the leads being arranged at a distance from the die pad;

wherein the die pad has a substantially flat bottom surface and a top surface, the top surface having a die attachment portion and a downbond attachment portion for connecting downbonds, the die attachment surface portion and the downbond attachment surface portion being at different levels from each other;

wherein, at least one location between the die attachment surface portion and the downbond attachment surface portion, the top surface of the die pad has at least one third surface portion that is out-of-plane with the die attachment surface portion, and at least one substantially step-shaped surface transition between the die attachment surface portion and said third surface portion, wherein the said third surface is at the same level as the downbond attachment surface portion, and wherein the downbond attachment surface portion is located closer to the bottom surface of the die pad than the die attachment surface portion.

14. Leadframe according to claim 13, wherein said step-shaped transition has been formed by etching away a part of the lead frame base material to form the downbond attachment surface portion.

15. Leadframe according to claim 11, wherein the die attachment surface portion is located closer to the bottom surface of the die pad than the downbond attachment surface portion.

16. Leadframe according to claim 15, wherein said step-shaped transition has been formed by etching away a part of the lead frame base material to form the die attachment surface portion.

17. Semi-conductor device, comprising:
a leadframe comprising a die pad for mounting a semi-conductor die and a plurality of leads for connection with the semi-conductor die, the leads being arranged at a distance from the die pad;
wherein the die pad has a substantially flat bottom surface and a top surface, the top surface having a die attachment portion and a downbond attachment portion for connecting downbonds, the die attachment surface portion and the downbond attachment surface portion being at different levels from each other;
wherein, at least one location between the die attachment surface portion and the downbond attachment surface portion, the top surface of the die pad has at least one third surface portion that is out-of-plane with the die attachment surface portion, and at least one substantially step-shaped surface transition between the die attachment surface portion and said third surface portion;
the semi-conductor die attached to the die attachment portion of the die pad, the semi-conductor die comprising an integrated circuit;
a plurality of standard bonds connecting said integrated circuit to respective leads;
a plurality of downbonds connecting said integrated circuit to the downbond attachment portion of the die pad; and
a plastic package encapsulating at least the semi-conductor die, the standard bonds and the downbonds.

18. Semi-conductor device according to claim 16, wherein the bottom surface of the leadframe is exposed.

19. Semiconductor device according to claim 17,
wherein, at a location between the die attachment surface position and the downbond attachment surface portion, the die pad has at least one recess in its top surface, wherein said third surface portion is defined by a bottom of said recess, and wherein said step-shaped transition is define d by a wall of said recess; and
wherein said at least one recess is entirely filled plastic material of the package.

* * * * *